(12) United States Patent
Dennard et al.

(10) Patent No.: US 8,395,438 B2
(45) Date of Patent: Mar. 12, 2013

(54) SWITCHED CAPACITOR VOLTAGE CONVERTERS

(75) Inventors: Robert H. Dennard, Croton-on-Hudson, NY (US); Brian L. Ji, Fishkill, NY (US); Robert K. Montoye, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/532,986

(22) Filed: Jun. 26, 2012

(65) Prior Publication Data

US 2012/0262226 A1  Oct. 18, 2012

Related U.S. Application Data

(63) Continuation of application No. 12/392,476, filed on Feb. 25, 2009, now Pat. No. 8,248,152.

(51) Int. Cl.
*G05F 1/10* (2006.01)
*G05F 3/02* (2006.01)
(52) U.S. Cl. ...................................... 327/536
(58) Field of Classification Search .................. 327/536; 363/59–60
See application file for complete search history.

(56) References Cited

U.S. PATENT DOCUMENTS

| | | |
|---|---|---|
| 4,752,699 A | 6/1988 | Cranford, Jr. et al. |
| 5,270,581 A | 12/1993 | Nakamura |
| 5,581,506 A | 12/1996 | Yamauchi |
| 5,631,816 A | 5/1997 | Brakus |
| 5,867,040 A | 2/1999 | Fuse et al. |
| 5,897,040 A | 4/1999 | Ward |
| 6,075,401 A | 6/2000 | Inoue et al. |
| 6,204,141 B1 | 3/2001 | Lou |
| 6,304,068 B1 | 10/2001 | Hui et al. |
| 6,600,220 B2 | 7/2003 | Barber et al. |
| 6,600,679 B2 | 7/2003 | Tanzawa et al. |
| 6,617,903 B2 | 9/2003 | Kawamura |
| 6,646,425 B2 | 11/2003 | Miftakhutdinov |
| 6,657,420 B1 | 12/2003 | Shacter |
| 6,744,297 B2 | 6/2004 | Huang |

(Continued)

FOREIGN PATENT DOCUMENTS

| | | |
|---|---|---|
| JP | 60239117 A | 11/1985 |
| WO | 2007054858 A2 | 5/2007 |

OTHER PUBLICATIONS

Charge Pumps: An Overview, [online]; [retrieved on Jan. 29, 2009]; retrieved from the Internet http://www.eceg.utoronto.ca/~kphang/ece1371/chargepumps.pdf Louie Pylarinos, "Charge Pumps: An Overview," pp. 1-7; 2003.

(Continued)

*Primary Examiner* — Quan Tra
(74) *Attorney, Agent, or Firm* — Cantor Colburn LLP; Vazken Alexanian

(57) ABSTRACT

An on-chip voltage conversion apparatus for integrated circuits includes a first capacitor; a first NFET device configured to selectively couple a first electrode of the first capacitor to a low side voltage rail of a first voltage domain; a first PFET device configured to selectively couple the first electrode of the first capacitor to a high side voltage rail of the first voltage domain; a second NFET device configured to selectively couple a second electrode of the first capacitor to a low side voltage rail of a second voltage domain, wherein the low side voltage rail of the second voltage domain corresponds to the high side voltage rail of the first voltage domain; and a second PFET device configured to selectively couple the second electrode of the first capacitor to a high side voltage rail of the second voltage domain.

17 Claims, 12 Drawing Sheets

U.S. PATENT DOCUMENTS

| | | | |
|---|---|---|---|
| 6,838,927 | B2 | 1/2005 | Oonishi |
| 7,051,306 | B2 | 5/2006 | Hoberman et al. |
| 7,095,619 | B2 | 8/2006 | Panella et al. |
| 7,116,594 | B2 | 10/2006 | Luk et al. |
| 7,190,210 | B2 | 3/2007 | Azrai et al. |
| 7,230,455 | B2 | 6/2007 | Luk |
| 7,257,723 | B2 | 8/2007 | Galles |
| 7,315,463 | B2 | 1/2008 | Schrom et al. |
| 7,342,389 | B1 | 3/2008 | Wu et al. |
| 7,348,800 | B2 | 3/2008 | Koto et al. |
| 7,358,573 | B2 | 4/2008 | Cecchi et al. |
| 7,518,481 | B2 | 4/2009 | Gardner et al. |
| 7,551,018 | B2 * | 6/2009 | Hsu et al. ............... 327/536 |
| 7,564,263 | B2 | 7/2009 | Walker et al. |
| 7,581,198 | B2 | 8/2009 | Huynh et al. |
| 7,609,114 | B2 | 10/2009 | Hsieh et al. |
| 7,750,717 | B2 | 7/2010 | Ali et al. |
| 7,768,309 | B2 | 8/2010 | Luich |
| 2002/0024374 | A1 | 2/2002 | Ovens et al. |
| 2003/0155897 | A1 | 8/2003 | Miftakhutdinov |
| 2005/0140426 | A1 | 6/2005 | Fujiwara |
| 2005/0145895 | A1 | 7/2005 | Luk et al. |
| 2005/0213267 | A1 | 9/2005 | Azrai et al. |
| 2005/0213280 | A1 | 9/2005 | Azrai et al. |
| 2006/0071650 | A1 | 4/2006 | Narendra et al. |
| 2006/0099734 | A1 | 5/2006 | Narendra et al. |
| 2006/0139086 | A1 | 6/2006 | Heinz et al. |
| 2008/0079461 | A1 | 4/2008 | Lin et al. |
| 2008/0080111 | A1 | 4/2008 | Lin et al. |
| 2008/0080112 | A1 | 4/2008 | Lin et al. |
| 2008/0080113 | A1 | 4/2008 | Lin et al. |
| 2008/0081457 | A1 | 4/2008 | Lin et al. |
| 2008/0081458 | A1 | 4/2008 | Lin et al. |
| 2008/0111242 | A1 | 5/2008 | Lin et al. |
| 2008/0162770 | A1 | 7/2008 | Titiano et al. |
| 2008/0239772 | A1 | 10/2008 | Oraw et al. |
| 2009/0033155 | A1 | 2/2009 | Kanno et al. |
| 2009/0059653 | A1 | 3/2009 | Luk et al. |
| 2009/0103382 | A1 | 4/2009 | Luk et al. |
| 2009/0289291 | A1 | 11/2009 | Cheng et al. |
| 2010/0033224 | A1 | 2/2010 | Acharya |
| 2010/0214014 | A1 | 8/2010 | Dennard et al. |

OTHER PUBLICATIONS

Cockcroft-Walton generator, [online]; [retrieved on Jan. 29, 2009]; retrieved from the Internet http://www.en.wikipedia.org/wiki/Cockcroft-Walton_generator Wikiipedia, "Cockcroft-Walton Generator," pp. 1-3; 2009.

D. Maurath et al.; "A self-adaptive switched-capacitor voltage converter with dynamic input load control for energy harvesting;" Proc. ESSCIRC; Sep. 14-18, 2009; pp. 284-287.

D. Stepanovic et al.; "Gated-diode Sense Amplifier for Robust Differential sensing in 6T SRAM;" Univ. of California, Berkeley; published on-line; pp. 1-6; May 3, 2007.

F H Khan et al., "A 5 kW Bi-directional Multilevel Modular DC-DC Converter (MMCCC) Featuring Built in Power Management for Fuel Cell and Hybrid Electric Automobiles," Vehicle Power and Propulsion Conference; Sep. 9, 2007, pp. 208-214, IEEE.

Gerhard Schrom, et al., Feasibility of Monolithic and 3D-Stacked DC-DC Converters for Microprocessors in 90nm Technology Generation, Copyright 2004 ACM, 6 pages.

International Search Report; International Application No. PCT/EP2010/051288; International Filing Date: Feb. 3, 2010; Date of mailing: Jun. 21, 2010; 5 pages.

J. Kwong et al.; "A 65 nm Sub-V Sub-t Microcontroller With Integrated SRAM and Switched Capacitor DC-DC Converter;" IEEE Journal of Solid-State Circuits, vol. 44, 1 , Jan. 2009; pp. 115-126.

U.S. Appl. No. 12/422,391; Notice of Allowance; Date Filed: Apr. 13, 2009; Date Mailed: Jan. 9, 2012; pp. 1-9.

U.S. Appl. No. 12/392,476; Final Office Action; Date Filed: Feb. 25, 2009; Date Mailed: Feb. 9, 2012; pp. 1-9.

U.S. Appl. No. 12/392,476; Non-Final Office Action; Date Filed: Feb. 25, 2009; Date Mailed Oct. 25, 2011; pp. 1-30.

U.S. Appl. No. 12/623,462; Non-Final Office Action; Date Filed: Nov. 23, 2009; Date Mailed: Feb. 6, 2012; pp. 1-26.

U.S. Appl. No. 12/422,391; Final Office Action; Date Filed: Apr. 13, 2009; Date Mailed: Sep. 7, 2011; pp. 1-10.

W. K. Luk et al.; "Gated-Diode Amplifiers;" IEEE Transaction on Circuits and Systems-II: Express Briefs, vol. 52, No. 5; May 2005, pp. 266-270.

Written Opinion of the International Searching Authority; International Application No. PCT/EP2010/051288; International Filing Date: Feb. 3, 2010; Date of mailing: Jun. 21, 2010; 5 pages.

International Search Report; International Application No. PCT/US/10/26748; International Filing Date: Mar. 10, 2010; Date of mailing: May 3, 2010; 7 pages.

Written Opinion; International Application No. PCT/US/10/26748; International Filing Date: Mar. 10, 2010; Date of mailing: May 3, 2010; 5 pages.

U.S. Appl. No. 13/552,091; Non-Final Office Action; Filing Date: Jul. 18, 2012; Date of Mailing: Oct. 25, 2012; pp. 1-16.

* cited by examiner

SWITCHED CAPACITOR VOLTAGE CONVERTERS

CROSS REFERENCE TO RELATED APPLICATION

This application is a continuation of U.S. Application Ser. No. 12/392,476, filed Feb. 25, 2009, the contents of which are incorporated in their entirety herein.

BACKGROUND

The present invention relates generally to voltage conversion techniques and, more particularly, to switched capacitor voltage converters and methods for integrated circuit devices.

Power management has become a critical component for advanced computing architectures, including both high-end microprocessor systems and mobile electronic devices. However, existing on-chip solutions have limited success in simultaneously achieving high output current and high power conversion efficiency.

In particular, nominal power supply voltage ($V_{DD}$) values for CMOS (complementary metal oxide semiconductor) technology have been gradually reduced over the past years due to performance and power scaling. In turn, maintaining efficiency in power delivery systems has become more difficult as $V_{DD}$ is scaled down. At $V_{DD}=1$ Volt (V), the energy loss from an external power source to the circuits operated at $V_{DD}$ is significant. Since the power loss on the delivery grid is inversely proportional to the square of the voltage ($V^2$), the efficiency issue on power delivery is further exacerbated for so-called "low" $V_{DD}$ circuits (e.g., about 300-500 millivolts (mV)).

Additionally, multiple supply voltages are required for logic circuits, SRAM, and embedded DRAM on the same IC chip. These voltages are generated using a linear series voltage regulator or an inductive buck converter. An on-chip linear regulator uses resistive elements to reduce the voltage and thus is not energy efficient. Traditionally, buck converters require discrete off-chip inductors to achieve high power conversion efficiency. However, due to the difficulty in integrating high quality inductors on silicon substrates, an on-chip integrated buck converter has poor power conversion efficiency.

Accordingly, it would be desirable to be able to provide improved voltage conversion systems for integrated circuit devices and systems having multiple voltage domains.

SUMMARY

In an exemplary embodiment, an on-chip voltage conversion apparatus for integrated circuits includes a first capacitor; a first NFET device configured to selectively couple a first electrode of the first capacitor to a low side voltage rail of a first voltage domain; a first PFET device configured to selectively couple the first electrode of the first capacitor to a high side voltage rail of the first voltage domain; a second NFET device configured to selectively couple a second electrode of the first capacitor to a low side voltage rail of a second voltage domain, wherein the low side voltage rail of the second voltage domain corresponds to the high side voltage rail of the first voltage domain; and a second PFET device configured to selectively couple the second electrode of the first capacitor to a high side voltage rail of the second voltage domain.

In another embodiment, an on-chip voltage conversion system for integrated circuits includes a clock source having a plurality of clock phases; a plurality of actuating signals corresponding to one of a plurality of phases; and a plurality of voltage converters controlled by the actuating signals, with each voltage converter including a first capacitor; a first NFET device configured to selectively couple a first electrode of the first capacitor to a low side voltage rail of a first voltage domain; a first PFET device configured to selectively couple the first electrode of the first capacitor to a high side voltage rail of the first voltage domain; a second NFET device configured to selectively couple a second electrode of the first capacitor to a low side voltage rail of a second voltage domain, wherein the low side voltage rail of the second voltage domain corresponds to the high side voltage rail of the first voltage domain; and a second PFET device configured to selectively couple the second electrode of the first capacitor to a high side voltage rail of the second voltage domain.

In another embodiment, an on-chip voltage conversion system for integrated circuits includes a clock source having a plurality of clock phases; a plurality of actuating signals corresponding to one of a plurality of phases; and a plurality of voltage converters controlled by the actuating signals, with each voltage converter including a first capacitor; a first pair of NFET and PFET devices associated with a first voltage domain, with a first NFET of the first pair configured to selectively couple a first electrode of the first capacitor to a low side voltage rail of the first voltage domain, and a first PFET of the first pair configured to selectively couple the first electrode of the first capacitor to a high side voltage rail of the first voltage domain; a second pair of NFET and PFET devices associated with a second voltage domain, with a second NFET of the second pair configured to selectively couple a second electrode of the first capacitor to a low side voltage rail of the second voltage domain, wherein the low side voltage rail of the second voltage domain corresponds to the high side voltage rail of the first voltage domain, and a second PFET of the second voltage domain configured to selectively couple the second electrode of the first capacitor to a high side voltage rail of the second voltage domain; and one or more additional capacitors in series with the first capacitor; one or more additional pairs of NFET and PFET devices associated with one or more additional voltage domains for each one or more additional capacitors so as to define a multiple level converter that nominally converts a voltage level of N voltage units to a voltage level of M voltage units and vice versa; wherein N also represents the total number of pairs of switching devices, N−1 represents the total number of capacitors, and 1 [M [N−1.

In still another embodiment, a method of implementing on-chip voltage conversion for integrated circuits includes using a first NFET device to selectively couple a first electrode of a first capacitor to a low side voltage rail of a first voltage domain; using a first PFET device to selectively couple the first electrode of the first capacitor to a high side voltage rail of the first voltage domain; using a second NFET device to selectively couple a second electrode of the first capacitor to a low side voltage rail of a second voltage domain, wherein the low side voltage rail of the second voltage domain corresponds to the high side voltage rail of the first voltage domain; and using a second PFET device to selectively couple the second electrode of the first capacitor to a high side voltage rail of the second voltage domain.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein are improved circuits and methods related to switched capacitor voltage converters and regulator techniques. Briefly stated, the embodiments presented herein utilize on-chip deep trench (DT) capacitors and silicon-on-insulator (SOI) complementary metal oxide semiconductor (CMOS) field effect transistor (FET) switches. In one embodiment for a 2-to-1 converter, two SOI, p-type FETs (PFETs) and two SOI, n-type FETs (NFETs) are used to accomplish the voltage conversion. In another embodiment for a 3-to-1 converter, three SOI PFETs and three SOI NFETs are used. A general architecture and methodology disclosed herein allows for voltage conversion between two voltages with an integer ratio. The disclosed system does not require high breakdown voltage switches. In addition, the disclosed system embodiments are reversible and may be used as a down-converter, an up-converter, or a negative voltage generator. In addition, an alternative embodiment contemplates utilizing bulk CMOS switches with triple well technology.

Further, the scalability of the disclosed system allows the integration of a very large number of individual voltage converters of multiple phases for smooth voltage output. As another aspect of the invention, voltage regulation is realized by changing the switching frequency.

Figure 1:
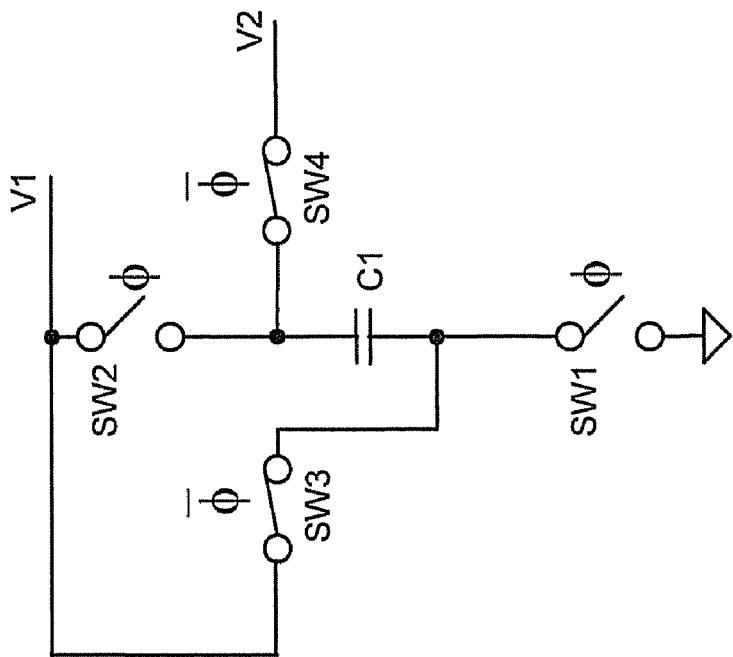
FIG. 1 is a schematic diagram of a conventional 2-to-1 switched capacitor voltage converter.

Switched capacitor converters are discussed in a number of texts, for example, see Kiyoo Itoh, Masashi Horiguchi, and Hitoshi Tanaka, "Ultra-Low Voltage Nano-Scale Memories", Springer, N.Y., 2007. Referring initially to FIG. 1, there is shown a schematic diagram illustrating the general topology of a conventional switched capacitor voltage converter 100 that performs either a voltage down-conversion from V2 to V1, or a voltage up-conversion from V1 to V2, wherein the voltage ratio of V2 to V1 is approximately equal to 2. In operation, a first pair of switches SW1 and SW2 is configured to couple a capacitor C1 between V1 and ground (as controlled by phase signal $\phi$). A second pair of switches SW3 and SW4 is also configured to couple the capacitor C1 between V2 and V1 (as controlled by phase signal $\bar{\phi}$). In voltage down-conversion, V2>2*V1. By the closing of SW3 and SW4, the capacitor C1 is charged toward a level of the voltage difference across C1 of the value (V2−V1). By the closing of SW1 and SW2, the capacitor C1 is charged toward a level of the voltage difference across C1 of the value (V1−GND). Therefore, the voltage difference across C1 has changed over a relatively small range that corresponds to the difference between the value of V1 and the value (V2−V1), which leads to high voltage conversion efficiency. For example, if V1 is 0.95 volts (V) and V2 is 2.0 V, then the voltage across C1 switches between 0.95 V and 1.05 V, leading to an intrinsic conversion efficiency of 95%.

Conventionally, there are number of ways to implement the specific switching elements and capacitors for the converter of FIG. 1. For example, the switches and capacitor may simply be provided off-chip. Alternatively, if the switches are implemented as MOSFETs on a bulk semiconductor substrate, there is typically a PFET switching device coupled to the upper voltage rail (e.g., V2 in a 2-to-1 converter) and NFET devices for the remaining switches. However, these transistor switches are typically subjected to relatively large gate voltage swings, which leads to significant energy loss and thus reduced energy conversion efficiency.

Also, the conventional on-chip capacitor solutions limit both the output current and energy conversion efficiency of the on-chip voltage converters. Due to the lack of high-density capacitors, the on-chip switched capacitor voltage converters are useful only for low current applications. The stray capacitance of conventional on-chip capacitors reduces the energy conversion efficiency.

Figure 2:
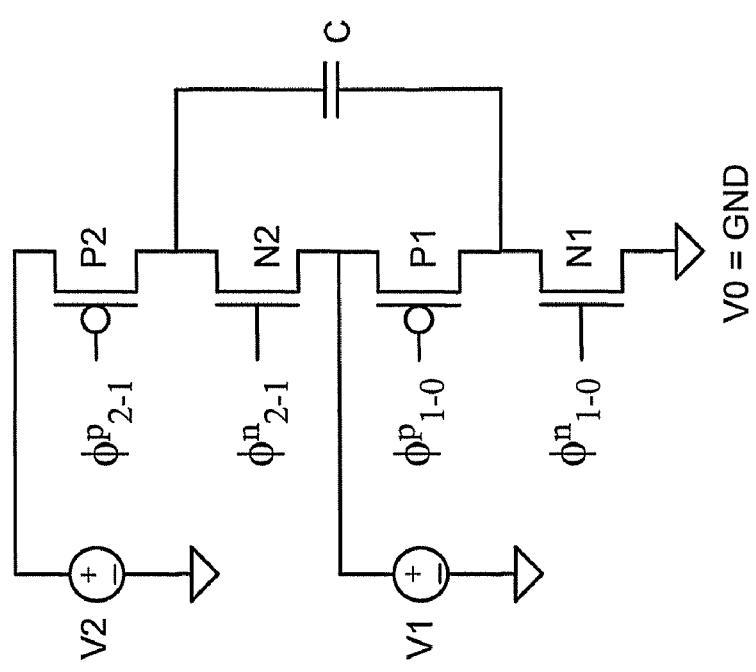
FIG. 2 is a schematic diagram of a 2-to-1 switched capacitor voltage converter, in accordance with an embodiment of the invention.

To improve the output current and energy efficiency of the on-chip switched capacitor voltage converter, the disclosed system uses on-chip deep trench (DT) capacitors and silicon-on-insulator (SOI) complimentary metal oxide semiconductor (CMOS) field effect transistor (FET) switches. Accordingly, FIG. 2 is a schematic diagram of a 2-to-1 switched capacitor voltage converter 200, in accordance with an embodiment of the invention, wherein the switches are implemented using SOI CMOS technology. More specifically, the 2-to-1 voltage converter 200 of FIG. 2 uses two PFETs, P1 and P2, and two NFETs, N1 and N2. P1 selectively couples a first capacitor electrode to the V1 rail, while P2 selectively couples the second capacitor electrode to the V2 rail. N1 selectively couples the first capacitor electrode to the ground rail while N2 selectively couples the second capacitor electrode to the V1 rail. In a down-conversion mode, V2 is the input voltage and V1 is the output voltage, where V2>2*V1. By way of a specific example, a down converter may operate with V2=2.0 V and V1=0.95 V. In an up-conversion mode, V1 is the input voltage and V2 is the output voltage, where V2<2*V1. By way of another specific example, an up converter may operate with V2=2.0 V and V1=1.05 V.

Figure 3:
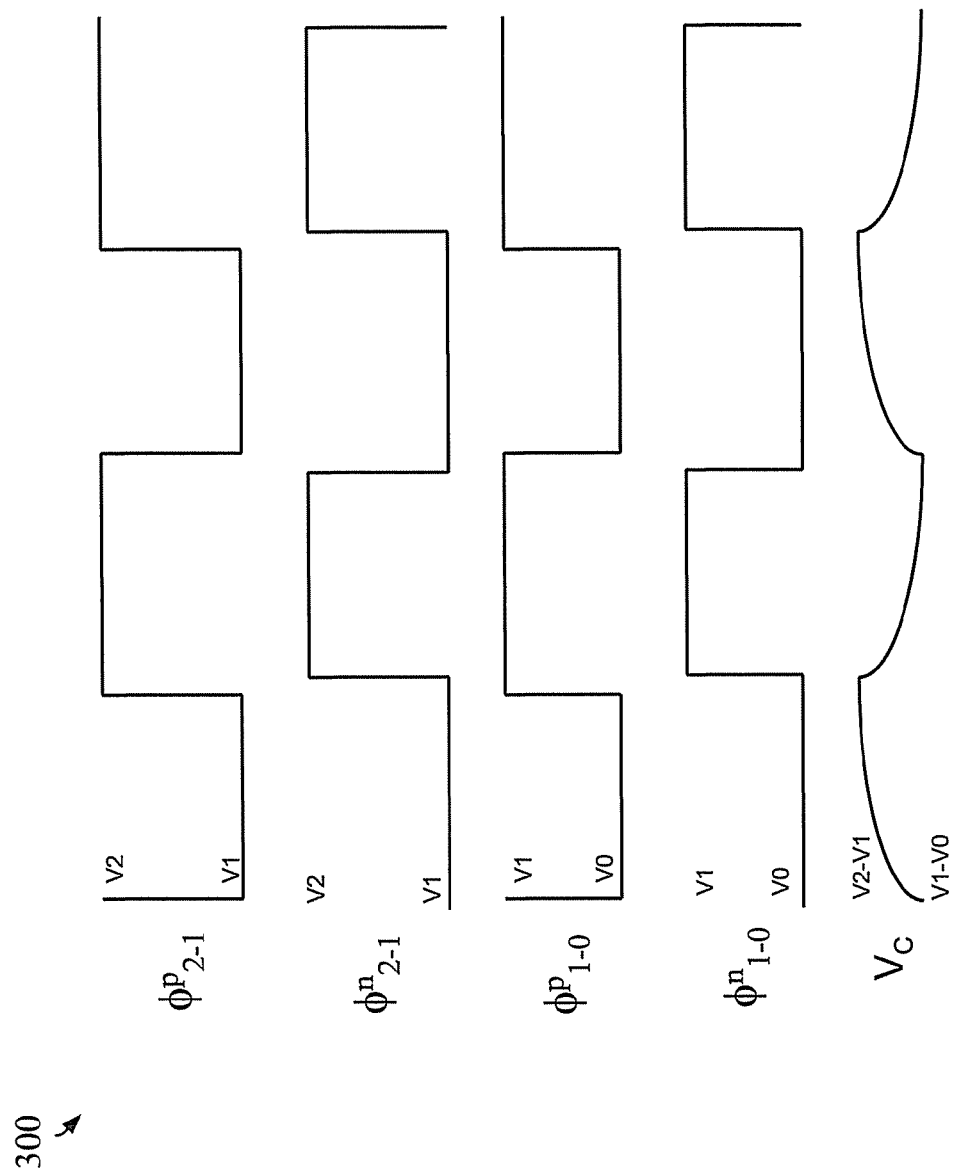
FIG. 3 is a voltage and timing diagram illustrating the operation of the voltage converter of FIG. 2.

The actuating (clock) signals applied to the gates of P2 and N2 ($\phi^p{}_{2\_1}$ and $\phi''{}_{2\_}$) swing between V1 and V2. Conversely, the actuating signals applied to the gates of P1 and N1 ($\phi^p{}_{1\_0}$ and $\phi''{}_{1\_0}$) swing between V0 (GND) and V1. A voltage and timing diagram 300 for these gate signals is shown in FIG. 3, together with the resulting voltage difference $V_C$ across the capacitor C. Non-overlap clocks are used to avoid a transient condition of creating a direct path from V2 to GND (i.e., preventing all four FETs from being simultaneously conductive). An advantageous aspect of this embodiment is that each transistor switch is only subjected to relatively small voltage swings. For example, the gate terminals of P2 and N2 in FIG. 2 are within the voltage domain between V2 and V1, while the gate terminals of P1 and N1 in FIG. 2 are within the voltage domain between V1 and V0.

The operation of the converter 200 of FIG. 2 in a down-conversion mode will be understood as follows. During the "P-cycle" where both PFETs, P1, P2 are conductive while both NFETs, N1, N2 are off, the capacitor C is charged from a lower voltage value (V1−V0) towards an upper value (V2−V1). During the "N-cycle" where both the PFETs are off while both the NFETs are on, the capacitor C is discharged from (V2−V1) to (V1−V0). In the limiting case of the cycle time being much greater than RC time constant, where R is the serial on-resistance of the switches, the charge output at V1 is 2*C*(V2+V0−2V1). Therefore, at the switching frequency f, the current output at V1 is given by the following expression:

$$\bar{I} = 2fC(V_2 + V_0 - 2V_1) \qquad \text{Eq. (1)}$$

Assuming V0=0, the intrinsic energy efficiency is given by:

$$\text{Energy Efficiency} = \frac{2V_1}{V_2} \qquad \text{Eq. (2)}$$

In the general case, a more complete solution is given by the following expression:

$$\bar{I} = \frac{2C(V_2 + V_0 - 2V_1)\left(1 - e^{-\frac{t_p}{(R_{p2}+R_{p1})C}}\right)\left(1 - e^{-\frac{t_n}{(R_{n2}+R_{n1})C}}\right)}{1 - e^{-\frac{t_p}{(R_{p2}+R_{p1})C}} e^{-\frac{t_n}{(R_{n2}+R_{n1})C}}} \cdot \frac{1}{t_p + t_n + t_d} \qquad \text{Eq. (3)}$$

where $t_p$ and $t_n$ are the times when the PFETs and NFETs are on, respectively, $t_d$ is the dead time that all FETs are off, and $R_{p1}$, $R_{p2}$, $R_{n1}$, and $R_{n2}$ are the on-resistance of the corresponding FETs.

Embodiments of the disclosed system use SOI CMOS transistors. Due to dielectric isolation of SOI transistors and their floating bodies, the small gate voltage swings as shown in FIG. 3 (e.g., the gate actuating signal for N2 swings between V1 and V2) allows the switches to be completely turned on and off. Because of the common body contact, operating in this configuration with dual-well bulk technology would generally problematic. Alternatively, at the cost of some additional silicon layout area, this circuit topology and voltage configuration is completely functional with bulk CMOS switches with triple well technology, where the wells for each transistor are isolated; and the well for N1 is tied to V0, the well for P1 is tied to V1, the well for N2 is tied to V1, and the well for P2 is tied to V2, respectively.

It will also be noted that the exemplary converter embodiment presented in FIG. 2 also utilizes on-chip, deep trench (DT) capacitors. This technology enables on-chip implementation of high density capacitors. The stray capacitance of the DT capacitor is very low, thereby minimizing the energy loss in charging the stray capacitor. Because of the scalability of both the DT capacitors and MOSFETs, the proposed voltage converter may be implemented with very fine granularity.

Furthermore, a system using many converters operating on many different clock phases leads to a smooth output current and system stability.

Figure 4:
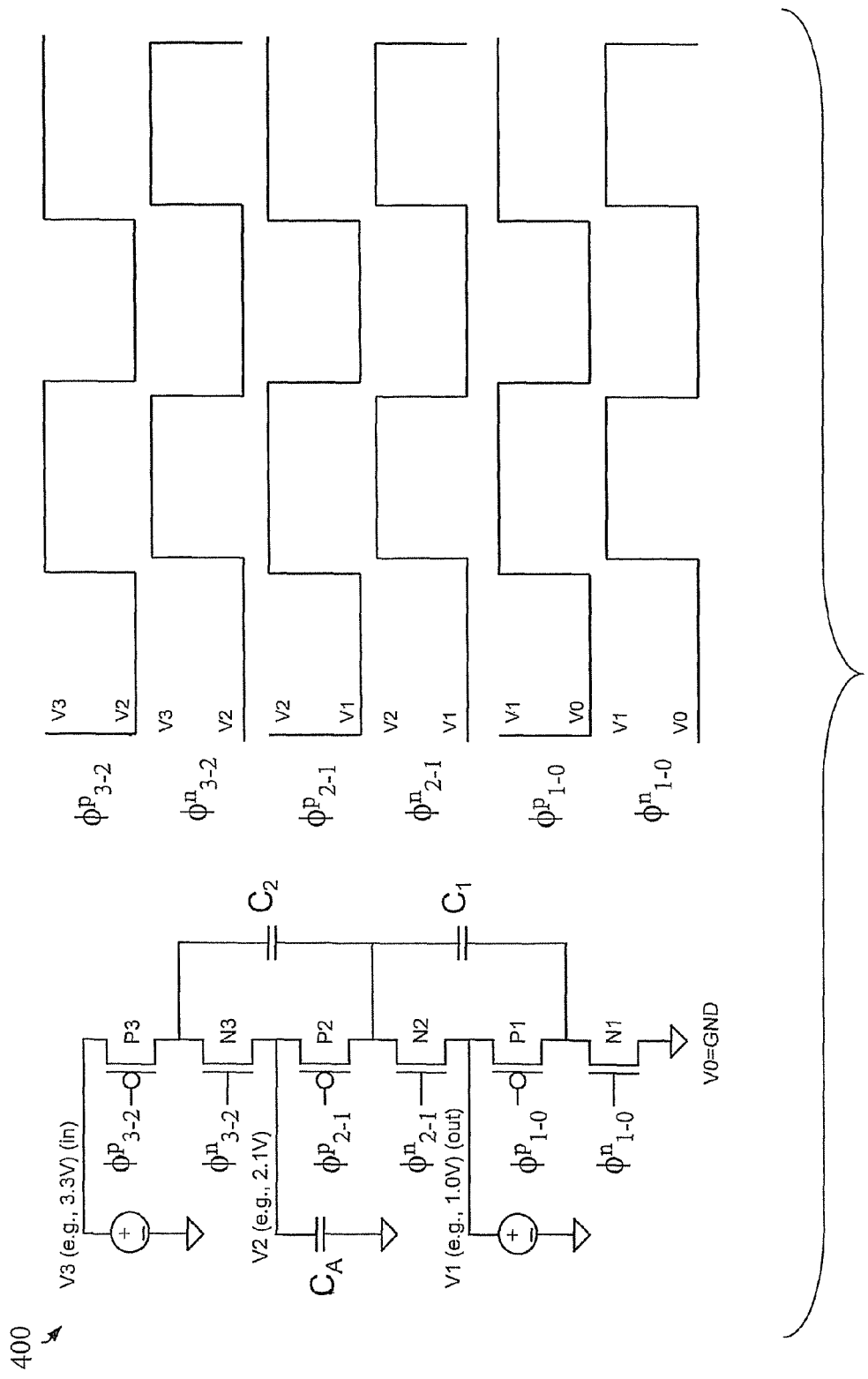
FIG. 4 is a of a 3-to-1 switched capacitor voltage converter and associated timing diagram, in accordance with a further embodiment of the invention.

Referring now to FIG. 4, there is shown a schematic diagram of a 3-to-1 switched capacitor voltage converter 400, in accordance with a further embodiment of the invention. As will be seen, the converter 400 is implemented with three PFETs and three NFETs embodied in SOI CMOS technology. Further, an intermediate voltage node V2 is available for multiple-phased converters. Whereas a conventional 3-to-1 converter generally requires high breakdown voltage devices (and is not compatible with high performance CMOS switches) the topology as presented in FIG. 4 advantageously uses only devices that are subjected to approximately $V_{dd}$. That is, as shown in the voltage and timing diagram in FIG. 4, the gate terminals of devices N1 and P1 operate in a voltage domain between V0 and V1; the gate terminals of devices N2 and P2 operate in a voltage domain between V1 and V2; and the gate terminals of devices N3 and P3 operate in a voltage domain between V2 and V3. As an exemplary 3-to-1 down converter, V0=0, V1=1 V, and V3=3.3 V. V2 is an internal node at approximately 2.1 V. As shown in FIG. 4, a capacitor $C_A$ is connected to V2 for keeping V2 stable; however, this additional capacitor $C_A$ is optional in multi-phased configuration. In an exemplary embodiment, the voltage conversion is done with many converters on different phases, where the V2 nodes are connected together. This method naturally forms a large capacitive charge reservoir for V2 that is stable, therefore the additional physical capacitor $C_A$ is not necessary.

The operation of the converter 400 of FIG. 4 in a down-conversion mode will be understood as follows. During the "P-cycle" where all PFETs, P1, P2, P3 are conductive while all NFETs, N1, N2, N3 are off, capacitor C1 is charged from a lower voltage value (V1−V0) towards an upper value (V2−V1) while capacitor C2 is charged from a lower voltage value (V2−V1) towards an upper value (V3−V2). During the "N-cycle" where all PFETs are off while all the NFETs are on, capacitor C1 is discharged from (V2−V1) to (V1−V0) while capacitor C2 is discharged from (V3−V2) to (V2−V1).

Figure 5:
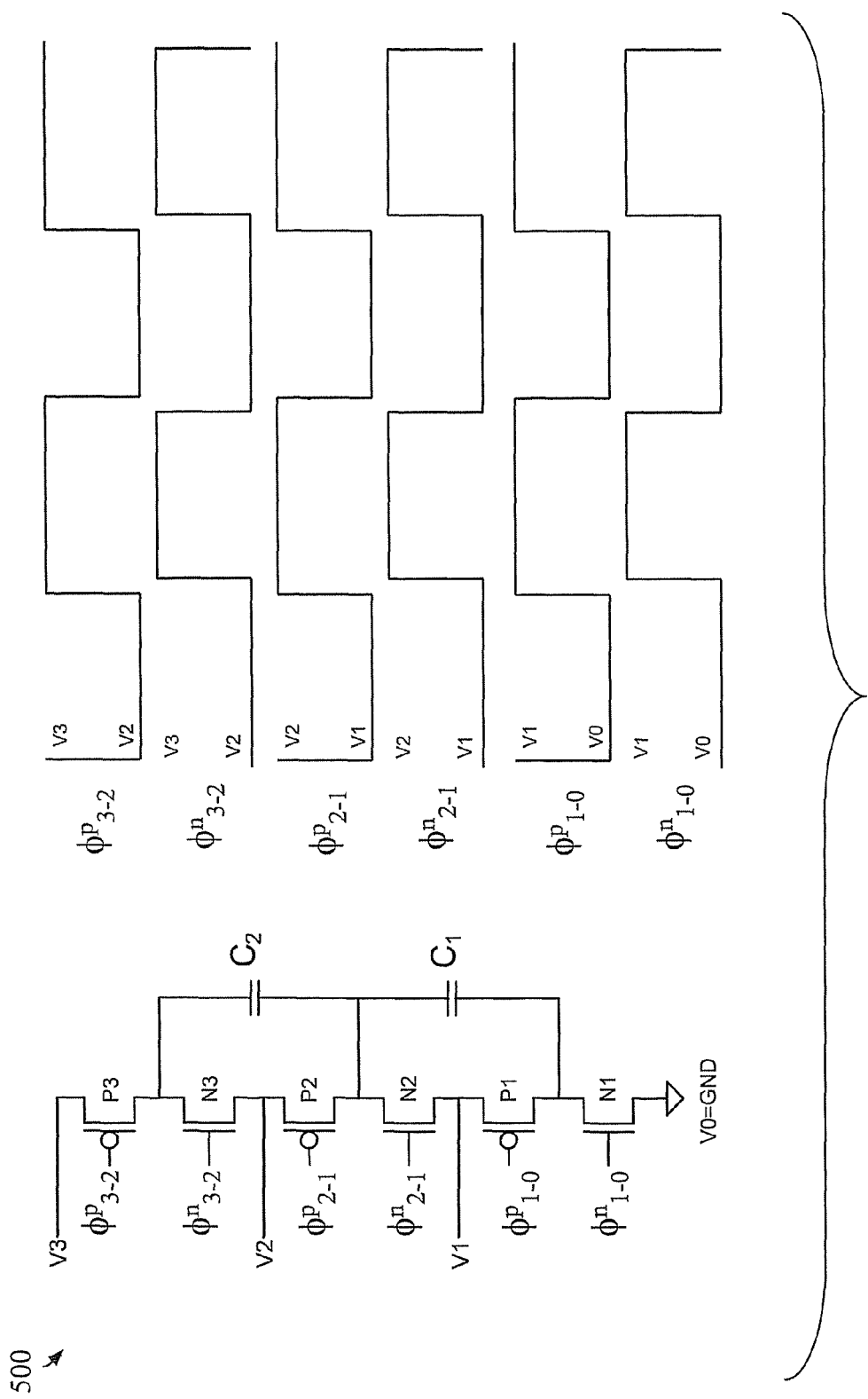
FIG. 5 is a schematic diagram illustrating the general circuit topology of the converter of FIG. 4.

FIG. 5 is a schematic diagram illustrating the general circuit topology of the 4-ports, reversible 3-to-1 voltage converter. In addition to the 3-to-1 down converter shown in FIG. 4, this topology can be used as a 3-to-2 down-converter, a 1-to-3 up-converter, or a 2-to-3 up-converter. In a 3-to-1 down-conversion mode, V3 is the input voltage and V1 is the output voltage, where V3>3*V1. In a 3-to-2 down-conversion mode, V3 is the input voltage and V2 is the output voltage, where V3>(3*V2)/2. In a 1-to-3 up-conversion mode, V1 is the input voltage and V3 is the output voltage, where V3<3*V1. In a 2-to-3 up-conversion mode, V2 is the input voltage and V3 is the output voltage, where V3<(3*V2)/2. In addition to using the combination of 3 PFET/3 NFET devices, the voltages across the capacitors C1 and C2 as well as the drain-to-source voltages of the FET switches are limited to a value that does not significantly larger than $V_{dd}$. A key advantage of the topology shown in FIG. 5 is that the gate voltages of switches are operating in smaller voltage domains. For example, as shown in FIG. 5, the gate voltages of P3 and N3 operate in a voltage domain between V3 and V2; the gate voltage of P2 and N2 operate in a voltage domain between V2 and V1; and the gate voltage of P1 and N1 operate in a voltage domain between V1 and V0. Moreover, the topology illustrated in FIG. 5 may be generalized to implement an N to M voltage conversion shown in FIG. 7, where N and M are integers.

Further disclosed herein a method to regulate the output voltage by varying the clock frequency. As indicated Eq. (1) above, the output current increases when V1 decreases. Conversely, the output current increases when f increases. Therefore, for a given relation of load current versus voltage, V1 regulation can be realized by a feedback loop control on the switching frequency f.

Figure 6:
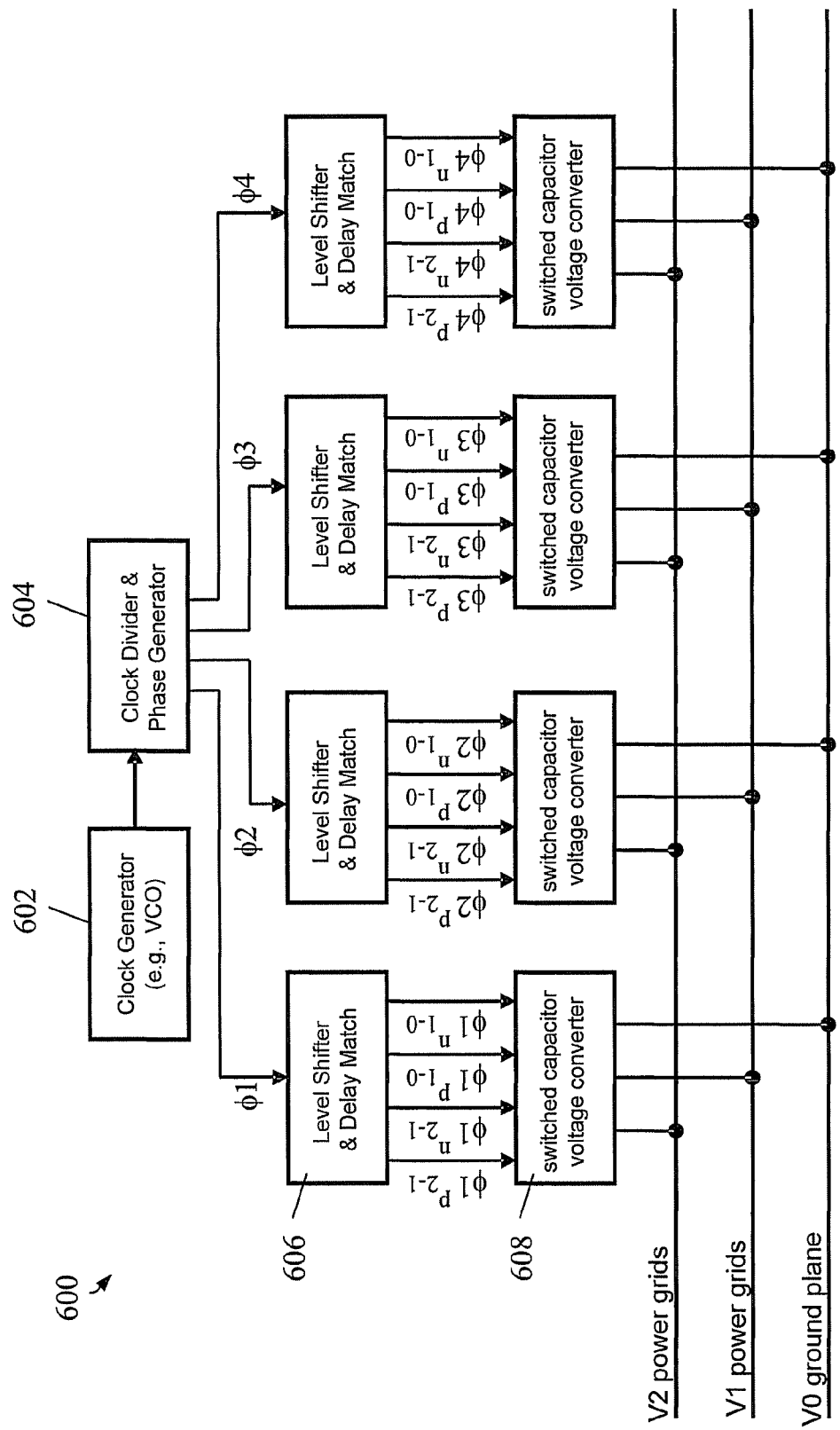
FIG. 6 is a schematic diagram of an exemplary, multi-phase voltage conversion system using the disclosed switched capacitor voltage converter embodiments, in accordance with a further embodiment of the invention.

An exemplary system-level implementation is illustrated in FIG. 6. The system 600 has power grids for V2 (e.g., input voltage), V1 (e.g., output voltage or Vdd for microprocessor cores), and V0 (e.g., ground plane). A clock generator 602 is implemented with frequencies controlled by a bias voltage. A clock divider and clock phase generator 604 receives an input clock signal from the clock generator 602, and generates output clock signals with multiple phases. In the exemplary embodiment depicted, four phases are generated in FIG. 6, which are designated as $\phi 1$, $\phi 2$, $\phi 3$, and $\phi 4$. Assuming these original clock signals from the clock generator and clock dividers swings between V1 and ground, then level shifters 606 are used to generate clock signals operating between V1 and V2, together with matching delays for the original clock signals operating between the ground and V1. These regenerated clock signals (for example, the signals $\phi^p_{2-1}$, $\phi''_{2-1}$, $\phi^p_{1-0}$, $\phi''_{1-0}$ for phase $\phi 1$) are then coupled to the voltage converters 608, such as illustrated in FIG. 2 described above. Again, this exemplary system may be extended for 3-to-1 voltage conversion, or more generally, N-to-M voltage conversions where the power grids for intermediate voltage levels can be used. It is also extendable to as many clock phases as needed.

Figure 7:
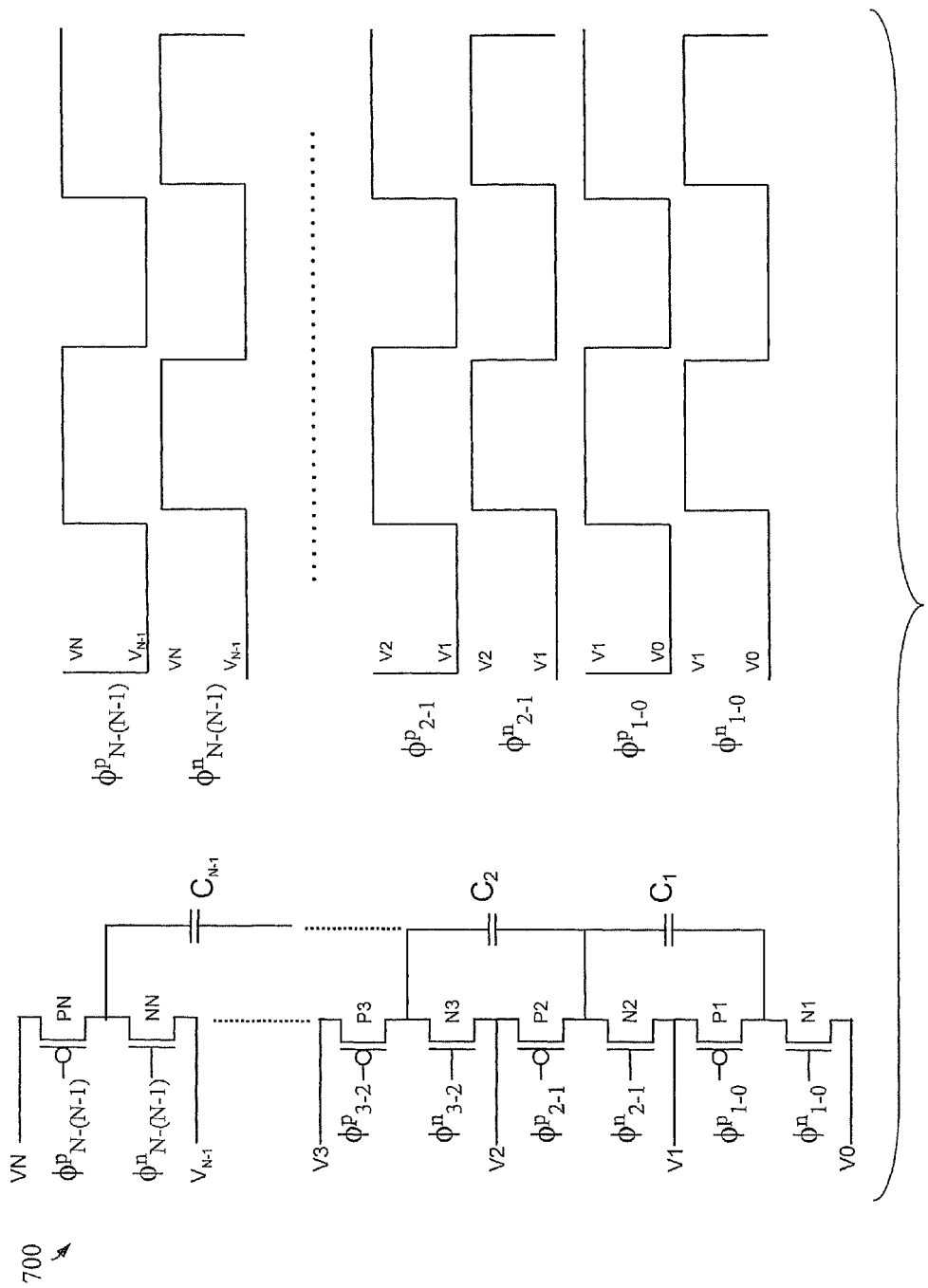
FIG. 7 is a schematic diagram of a general switched capacitor voltage converter with N+1 voltage levels, in accordance with a further embodiment of the invention.

FIG. 7 is a schematic diagram illustrating an overall general circuit topology of the disclosed voltage converter system. This system includes N+1 voltage levels, denoted as V0, V1, V2, ..., VN, wherein V0 represents the lowest voltage level and VN represents the highest voltage level. V0 can also be referred to as a reference level, where all other voltage levels have a nominal value of integer ratio to V0. The nominal value of the voltage levels may be expressed as follows:

$$V_1 - V_0 = (V_1 - V_0)$$ Eq. (4)
$$V_2 - V_0 = 2(V_1 - V_0)$$
$$V_3 - V_0 = 3(V_1 - V_0)$$
$$...$$
$$V_M - V_0 = M(V_1 - V_0)$$
$$...$$
$$V_N - V_0 = N(V_1 - V_0)$$

As shown in FIG. 7, for a system of N+1 voltage levels, there are a total of N−1 capacitors, denoted as C1, C2, ... and $C_{N-1}$. There are also N pairs of PMOS and NMOS switches, operated on two non-overlap clock phases, denoted by $\phi^p$ and $\phi''$. In the "N-cycle", the lower switch (NFET) of each switch pair is on while the upper switch (PFET) is off. Therefore, the lower electrode of the capacitor C1 is connected to V0 while the lower electrode of the capacitor C2 is connected to V1, and so on, such that the lower electrode of the capacitor $C_{N-1}$ is connected to $V_{N-2}$, and the upper electrode of the capacitor $C_{N-1}$ is connected to $V_{N-1}$. In the "P-cycle", the upper switch (PFET) of each switch pair is on while the lower switch (NFET) is off. Therefore, the lower electrode of the capacitor C1 is connected to V1, the lower electrode of the capacitor C2 is connected to V2, and so on, such that the lower electrode of the capacitor $C_{N-1}$ is connected to $V_{N-1}$, and the upper electrode of the capacitor $C_{N-1}$ is connected to VN. Again, since $\phi^p$ and $\phi''$ are non-overlapping clock signals, all switches are off during the phase that both $\phi^p$ and $\phi''$ are off. Excluding the energy needed to operate the switches, this system has an equilibrium position at the nominal voltage levels given by Eq. (4). Away from the equilibrium, electrical charge will flow out from the system on the voltage levels that are lower than the nominal values, and electrical charge will flow into the system on the voltage levels that are higher than the nominal values. This is the physical basis for the voltage conversion.

Figure 8:
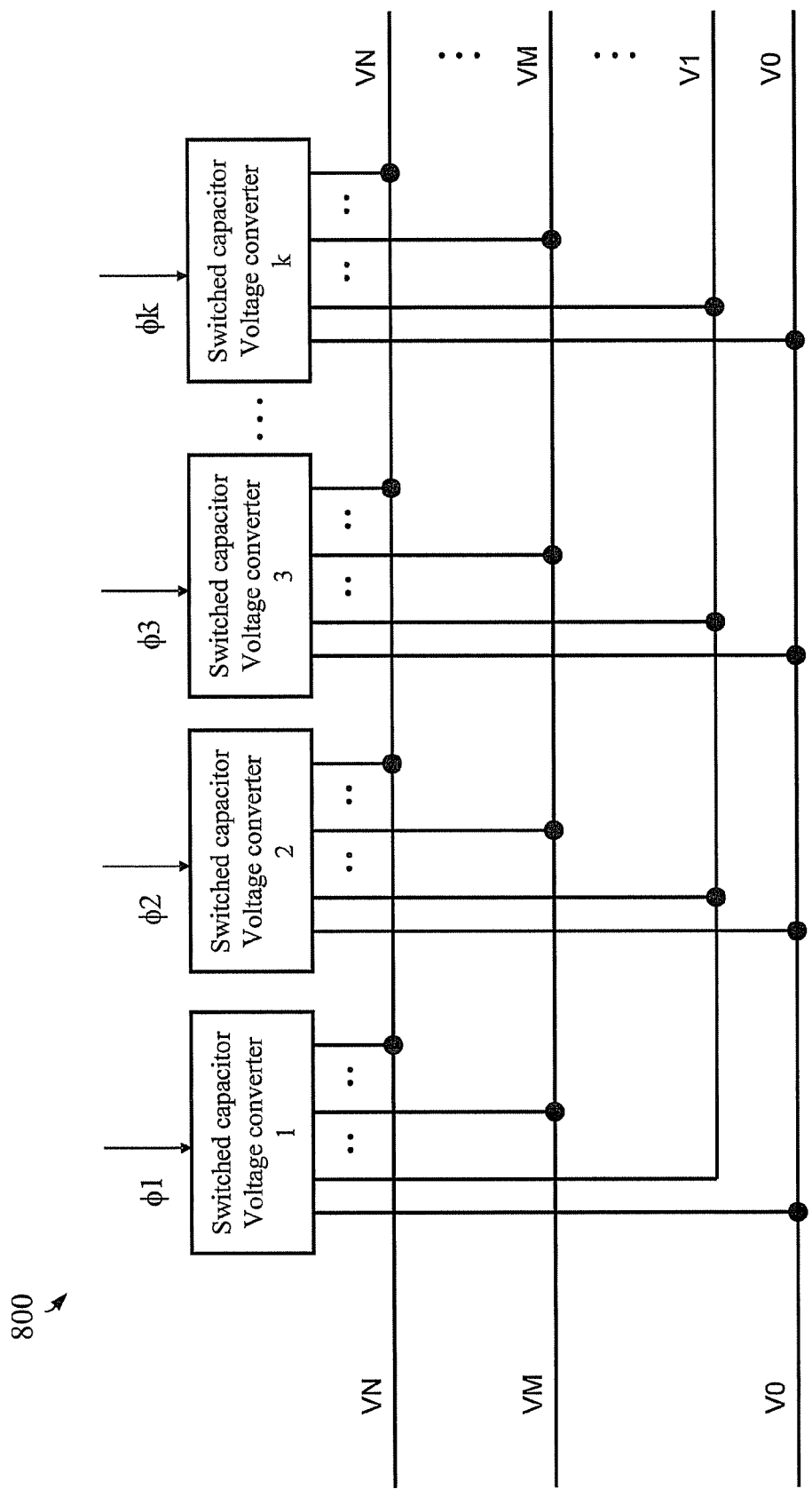
FIG. 8 is a schematic diagram of an exemplary multi-level voltage converter system using a total of k switched capacitor voltage converters shown in FIG. 8, in accordance with a further embodiment of the invention.
Figure 9:
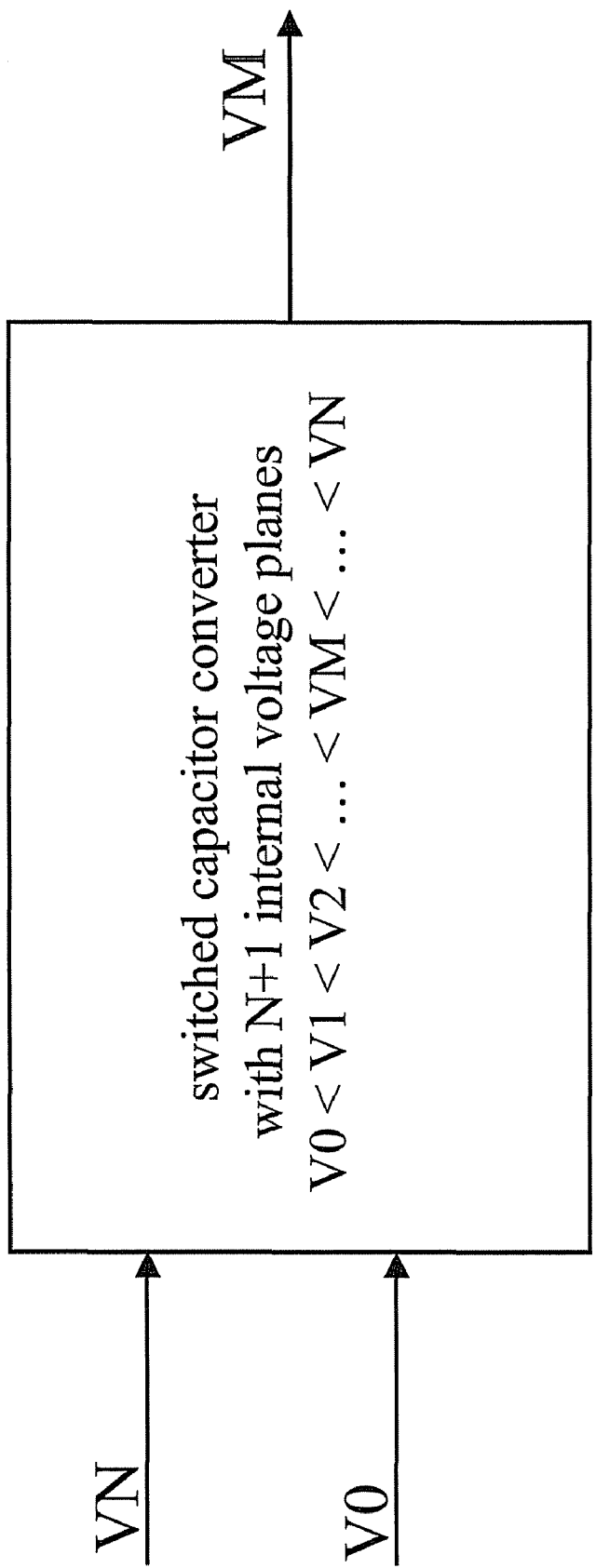
FIG. 9 is a schematic diagram of an exemplary N-to-M voltage down-converter system using the multi-phase voltage conversion system of FIG. 8.
Figure 10:
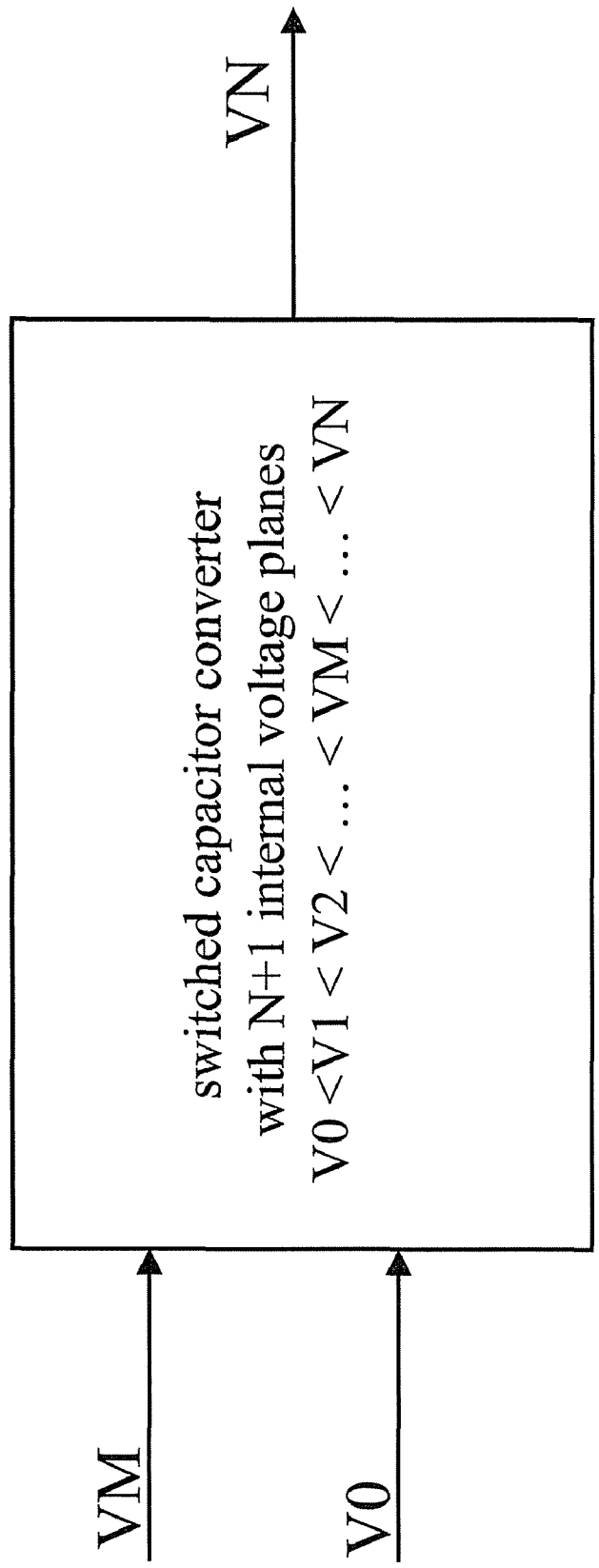
FIG. 10 is a schematic diagram of an exemplary M-to-N voltage up-converter system using the multi-phase voltage conversion system of FIG. 8.
Figure 11:
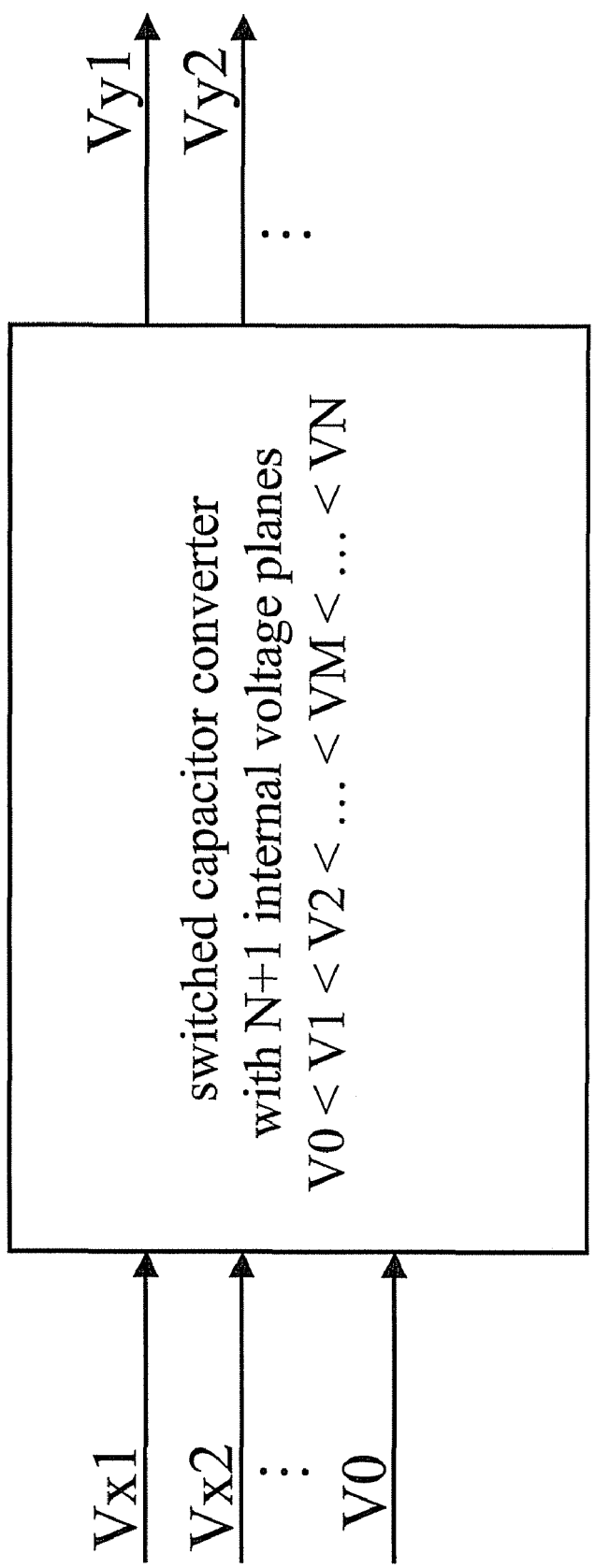
FIG. 11 is a schematic diagram of a multi-level voltage conversion system using the system of FIG. 8, with multiple input and output voltages.

FIG. 8 is a schematic diagram of an exemplary multi-level voltage converter system 800 using a total of k switched capacitor voltage converters of FIG. 7. These k switched capacitor voltage converters are operated on a set of clock phases, with the total number of different phases in the set to be less than or equal to the number N. There are N+1 internal voltage planes, as denoted by V1, V1, ..., VN. All or a subset of the internal voltage planes may be externally connected with respect to the converter circuit. In the system 800 depicted in FIG. 8, V0, VM, and VN are input and output voltages. As will be appreciated, the system may be used for up-conversion, down-conversion, or a combination of both, as well as for multiple input and multiple output voltage levels. FIGS. 9 through 11 depict some exemplary conversion implementations in this regard.

For example, FIG. 9 is a schematic diagram of an exemplary N-to-M voltage down-converter configuration using the multi-phase voltage conversion system 800 of FIG. 8. In this example, V0 is the reference level, VN is the input voltage level and VM is the output voltage level. By way of comparison, FIG. 10 is a schematic diagram of an exemplary M-to-N voltage up-converter system using the multi-phase voltage conversion system 800 of FIG. 8. Here, V0 is the reference level, VM is the input voltage level and VN is the output voltage level. FIG. 11 is a schematic diagram of an exemplary multi-level voltage conversion configuration using the system of FIG. 8. Again, V0 is the reference level, with a plurality of input voltages designated as Vx1, Vx2, etc., and a plurality of output voltages designated as Vy1, Vy2, etc.

Figure 12:
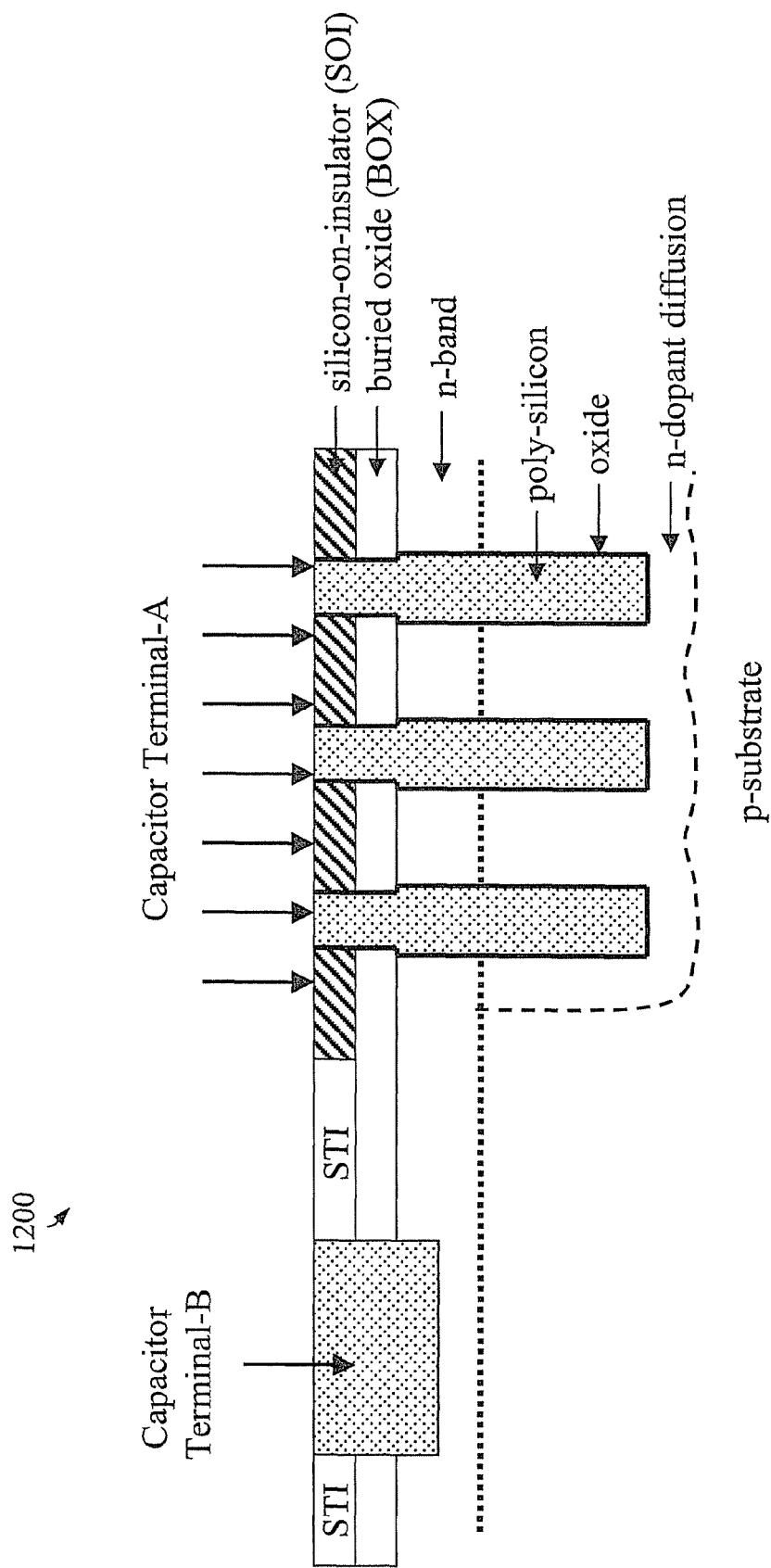
FIG. 12 is a schematic diagram of an exemplary switched capacitor implemented using a deep trench capacitor array.

Finally, FIG. 12 is a schematic of an exemplary switched capacitor 1200 implemented using deep trench capacitor arrays. It is made available using high density embedded DRAM technology. The capacitor 1200 includes capacitive deep trench arrays 1202 formed in silicon-on-insulator (SOI) embedded DRAM technology, where the deep trench is formed through the SOI and buried oxide (BOX) layers and into the silicon substrate. After the oxidation (which forms the insulating layer for the capacitor), the trench is filled with polysilicon. The parasitic capacitance of deep trench structure (comes from the boundary of p-substrate and n-dopant diffusion area) is very low, estimated to be less than 0.1% of the total capacitance. This leads to high energy efficiency, as the loss due to the parasitic capacitance is reduced. Such capacitor arrays also provide extremely high density and granularity, to fit into many applications. As an example, a load current of 50 A (amperes) for a high performance microprocessor can be supplied by 10,000 voltage converters each generating 5 milliamps (mA) of output current with a 100 picofarad (pF) switched capacitor. The 100 pF capacitor may be formed using 5000 deep trenches, each contributing about 20 fF of capacitance. The 10,000 voltage converters could operate on multiple (for example, 8 or 16) phases to provide a smooth total current output.

The disclosed system is fully functional with any forms of capacitors. In particular, an alternative technology for high density on-chip capacitors is using the stacked capacitor method. The stacked capacitor method is developed in DRAM technology as alternative to the deep trench capacitor, wherein the capacitor is stacked above the surface of silicon rather than trenching it down into the silicon.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An on-chip voltage conversion apparatus for integrated circuits, comprising:
    a first capacitor;
    a first NFET device configured to selectively couple a first electrode of the first capacitor to a low side voltage rail of a first voltage domain;
    a first PFET device configured to selectively couple the first electrode of the first capacitor to a high side voltage rail of the first voltage domain;
    a second NFET device configured to selectively couple a second electrode of the first capacitor to a low side voltage rail of a second voltage domain, wherein the low side voltage rail of the second voltage domain corresponds to the high side voltage rail of the first voltage domain; and
    a second PFET device configured to selectively couple the second electrode of the first capacitor to a high side voltage rail of the second voltage domain;
    wherein actuating signals for the first NFET device and first PFET device are decoupled from one another such that the actuating signal for the first NFET device begins to transition from low to high after the actuating signal for the first PFET device begins to transition from low to high, and the actuating signal for the first PFET device begins to transition from high to low after he actuating signal for the first NFET device begins to transition from high to low; and
    wherein actuating signals for the first NFET device and second PFET device are decoupled from one another such that the actuating signal for the second NFET device begins to transition from low to high after the actuating signal for the second PFET device begins to transition from low to high, and the actuating signal for the second PFET device begins to transition from high to low after he actuating signal for the second NFET device begins to transition from high to low.

2. The apparatus of claim 1, wherein the first capacitor comprises a deep trench capacitor.

3. The apparatus of claim 1, wherein the first and second NFET and PFET devices are formed on a silicon-on-insulator (SOI) substrate.

4. The apparatus of claim 1, wherein actuating signals to the first and second NFET and PFET devices are applied so as to charge and discharge the first capacitor between a first magnitude corresponding to the voltage difference across the first voltage domain and a second magnitude corresponding to the voltage difference across the second voltage domain.

5. The apparatus of claim 1, wherein for a down-conversion mode operation, the high side voltage rail of the second voltage domain, V2, is an input voltage and the high side voltage rail of the first voltage domain, V1, is an output voltage, such that $V2>2*V1$.

6. The apparatus of claim 1, wherein for an up-conversion mode operation, the high side voltage rail of the first voltage domain, V1, is an input voltage and the high side voltage rail of the second voltage domain, V2, is an output voltage, such that $V2<2*V1$.

7. The apparatus of claim 4, wherein the actuating signals to the first and second NFET and PFET devices are applied in a manner so as to prevent simultaneous conduction of any NFET device and any PFET device.

8. The apparatus of claim 4, wherein an output current is proportional to a switching frequency of the actuating signals.

9. The apparatus of claim 1, wherein:
    gate terminals of the first NFET and PFET devices operate entirely within the first voltage domain; and
    gate terminals of the second NFET and PFET devices operate entirely within the second voltage domain.

10. The apparatus of claim 1, wherein the first and second NFET and PFET devices are formed on bulk silicon substrates with triple well technology.

11. An on-chip voltage conversion system for integrated circuits, comprising:
    a clock source having a plurality of clock phases;
    a plurality of actuating signals corresponding to one of a plurality of phases; and
    a plurality of voltage converters controlled by the actuating signals, with each voltage converter comprising:
        a first capacitor;
        a first NFET device configured to selectively couple a first electrode of the first capacitor to a low side voltage rail of a first voltage domain;
        a first PFET device configured to selectively couple the first electrode of the first capacitor to a high side voltage rail of the first voltage domain;
        a second NFET device configured to selectively couple a second electrode of the first capacitor to a low side voltage rail of a second voltage domain, wherein the low side voltage rail of the second voltage domain corresponds to the high side voltage rail of the first voltage domain; and
        a second PFET device configured to selectively couple the second electrode of the first capacitor to a high side voltage rail of the second voltage domain;
        wherein actuating signals for the first NFET device and first PFET device are decoupled from one another such that the actuating signal for the first NFET device begins to transition from low to high after the actuating signal for the first PFET device begins to transition from low to high, and the actuating signal for the first PFET device begins to transition from high to low after he actuating signal for the first NFET device begins to transition from high to low; and
        wherein actuating signals for the first NFET device and second PFET device are decoupled from one another such that the actuating signal for the second NFET device begins to transition from low to high after the actuating signal for the second PFET device begins to transition from low to high, and the actuating signal for the second PFET device begins to transition from high to low after he actuating signal for the second NFET device begins to transition from high to low.

12. A method of implementing on-chip voltage conversion for integrated circuits, the method comprising:

using a first NFET device to selectively couple a first electrode of a first capacitor to a low side voltage rail of a first voltage domain;
using a first PFET device to selectively couple the first electrode of the first capacitor to a high side voltage rail of the first voltage domain;
using a second NFET device to selectively couple a second electrode of the first capacitor to a low side voltage rail of a second voltage domain, wherein the low side voltage rail of the second voltage domain corresponds to the high side voltage rail of the first voltage domain; and
using a second PFET device to selectively couple the second electrode of the first capacitor to a high side voltage rail of the second voltage domain;
wherein actuating signals for the first NFET device and first PFET device are decoupled from one another such that the actuating signal for the first NFET device begins to transition from low to high after the actuating signal for the first PFET device begins to transition from low to high, and the actuating signal for the first PFET device begins to transition from high to low after he actuating signal for the first NFET device begins to transition from high to low; and
wherein actuating signals for the first NFET device and second PFET device are decoupled from one another such that the actuating signal for the second NFET device begins to transition from low to high after the actuating signal for the second PFET device begins to transition from low to high, and the actuating signal for the second PFET device begins to transition from high to low after he actuating signal for the second NFET device begins to transition from high to low.

13. The method of claim 12, wherein the first capacitor comprises a deep trench capacitor.

14. The method of claim 13, wherein the first and second NFET and PFET devices are formed on a silicon-on-insulator (SOI) substrate.

15. The method of claim 12, further comprising applying actuating signals to the first and second NFET and PFET devices so as to charge and discharge the first capacitor between a first magnitude corresponding to the voltage difference across the first voltage domain and a second magnitude corresponding to the voltage difference across the second voltage domain.

16. The method of claim 15, wherein for a down-conversion mode operation, the voltage of the second voltage domain, V2, is an input voltage and the voltage of the first voltage domain, V1, is an output voltage, such that $V2>2*V1$.

17. The method of claim 15, wherein for an up-conversion mode operation, the voltage of the first voltage domain, V1, is an input voltage and the voltage of the second voltage domain, V2, is an output voltage, such that $V2<2*V1$.

* * * * *